United States Patent
Wesslin et al.

(10) Patent No.: US 12,180,587 B2
(45) Date of Patent: Dec. 31, 2024

(54) VACUUM CHAMBER AND ARRANGEMENT FOR ATOMIC LAYER DEPOSITION

(71) Applicant: BENEQ OY, Espoo (FI)

(72) Inventors: Johannes Wesslin, Espoo (FI); Pekka Soininen, Espoo (FI); Jonas Andersson, Espoo (FI)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 18/475,300

(22) Filed: Sep. 27, 2023

(65) Prior Publication Data
US 2024/0026535 A1   Jan. 25, 2024

Related U.S. Application Data

(63) Continuation of application No. PCT/FI2022/050199, filed on Mar. 29, 2022.

(30) Foreign Application Priority Data

Mar. 30, 2021 (FI) ..................................... 20215370

(51) Int. Cl.
*C23C 16/455* (2006.01)
*C23C 16/458* (2006.01)
(Continued)

(52) U.S. Cl.
CPC .... *C23C 16/45544* (2013.01); *C23C 16/4587* (2013.01); *H01L 21/6719* (2013.01); *H01L 21/68764* (2013.01)

(58) Field of Classification Search
CPC .......... C23C 16/45544; C23C 16/4587; C23C 16/45525–45555; C23C 14/24–325;
(Continued)

(56) References Cited

U.S. PATENT DOCUMENTS 5,855,680 A    1/1999  Soininen et al.
6,300,225 B1 * 10/2001 Okamura .............. C23C 16/509
                                                      118/725
(Continued)

FOREIGN PATENT DOCUMENTS

KR   20210009838 A   1/2021
WO      2005113853 A1  12/2005
WO      2019037873 A1   2/2019

OTHER PUBLICATIONS

International Search Report issued by the Finnish Patent and Registration Office acting as the International Searching Authority in relation to International Application No. PCT/FI2022/050199 dated Jun. 30, 2022 (4 pages).
(Continued)

*Primary Examiner* — Aiden Lee
(74) *Attorney, Agent, or Firm* — Robert P. Michal, Esq.; Carter, DeLuca & Farrell LLP

(57) ABSTRACT

A vacuum chamber and an arrangement for atomic layer deposition. The vacuum chamber includes a loading wall provided with a loading opening, a back wall opposite the loading wall, and a first direction extending in a direction between the loading wall and the back wall. The vacuum chamber further includes a first vacuum chamber support rail inside the vacuum chamber and extending in the first direction, and a second vacuum chamber support rail inside the vacuum chamber and extending in the first direction and arranged spaced apart from the first vacuum chamber support rail. The first vacuum chamber support rail is arranged independently movable in vertical direction, and the second vacuum chamber support rail is arranged independently movable in vertical direction.

19 Claims, 12 Drawing Sheets

(51) Int. Cl.
*H01L 21/67* (2006.01)
*H01L 21/687* (2006.01)

(58) Field of Classification Search
CPC ............. H01L 21/677; H01L 21/67703; H01L 21/67739; H01L 21/67742; H01L 21/67745; H01L 21/67748; H01L 21/67751; H01L 21/67754; H01L 21/67757; H01L 21/6776
See application file for complete search history.

(56) References Cited

U.S. PATENT DOCUMENTS

| | | |
|---|---|---|
| 2007/0231109 A1 | 10/2007 | Pak et al. |
| 2012/0067284 A1 | 3/2012 | Soininen et al. |
| 2012/0155994 A1 | 6/2012 | Kishimoto et al. |
| 2015/0221469 A1* | 8/2015 | Miyamoto .............. H01J 37/16 356/508 |
| 2018/0010237 A1* | 1/2018 | Forseth ................... C23C 14/50 |
| 2020/0027919 A1* | 1/2020 | Van Hoogdalem ..... C23C 14/28 |

OTHER PUBLICATIONS

Written Opinion of the International Searching Authority issued by the Finnish Patent and Registration Office acting as the International Searching Authority in relation to International Application No. PCT/FI2022/050199 dated Jun. 30, 2022 (5 pages).
Finnish Search Report issued by the Finnish Patent and Registration Office in relation to Finnish Application No. 20215370 dated Oct. 27, 2021 (2 pages).

\* cited by examiner

VACUUM CHAMBER AND ARRANGEMENT FOR ATOMIC LAYER DEPOSITION

CROSS-REFERENCE TO RELATED APPLICATIONS

This application is a continuation of PCT International Application No. PCT/FI2022/050199 filed Mar. 29, 2022, which claims priority to Finnish Patent Application No. 20215370, filed Mar. 30, 2021, the disclosure of each of these applications is expressly incorporated herein by reference in their entirety.

FIELD OF THE INVENTION

The present invention relates to a vacuum chamber for atomic layer deposition. The present invention further relates to an arrangement for atomic layer deposition.

BACKGROUND OF THE INVENTION

There are basically two kinds of atomic layer deposition apparatus with a double chamber structure. The atomic layer deposition apparatus may comprise a vacuum chamber and a fixed and integral reaction chamber inside the vacuum chamber. Alternatively, the atomic layer deposition apparatus may comprise a vacuum chamber and a separate and movable reaction chamber which may be loaded to and unloaded from the vacuum chamber. The latter is preferable in many applications as it enables loading sensitive substrate into and from the reaction chamber in more efficient and simple manner outside the vacuum chamber. The substrates are first loaded into the movable reaction chamber outside the vacuum chamber and then the movable reaction chamber is loaded into the vacuum chamber. Precursor connections and discharge connections need to be connected to the reaction chamber inside the vacuum chamber. Further, after the processing the precursor and discharge connections need to be disconnected and then the reaction chamber is unloaded from the vacuum chamber. The substrates are subsequently unloaded form the reaction chamber outside the vacuum chamber.

One of the problems associated with the prior art movable reaction chamber is precise positioning of the reaction chamber inside the vacuum chamber. Positioning the reaction chamber inside the vacuum chamber becomes increasingly difficult when the size and weight of the reaction chamber increases. The precise positioning of the reaction chamber is necessary for providing the precursor connections and discharge connections. This positioning is difficult and time consuming which increases the downtime of the atomic layer deposition apparatus. Further, when the size of the movable reaction chamber increases, making the precursor connections and discharge connections manually becomes difficult and also time consuming.

BRIEF DESCRIPTION OF THE INVENTION

An object of the present invention is to provide a vacuum chamber and an arrangement for atomic layer deposition so as to solve or at least alleviate the prior art disadvantages.

The objects of the invention are achieved by a vacuum chamber for atomic layer deposition. The objects of the invention are achieved by an arrangement for atomic layer deposition.

The preferred embodiments of the invention are disclosed in the dependent claims.

The invention is based on the idea of providing a vacuum chamber for atomic layer deposition. The vacuum chamber comprises a loading wall provided with a loading opening, a back wall opposite the loading wall, and a first direction extending in a direction between the loading wall and the back wall. The vacuum chamber also comprises one or more side walls extending between the loading wall and the back wall, the one or more side walls defining a vacuum chamber space inside vacuum chamber.

According to the present invention, the vacuum chamber further comprises a first vacuum chamber support rail arranged inside the vacuum chamber and extending in the first direction, the first vacuum chamber support rail being arranged movable in relation to the vacuum chamber in vertical direction.

The movable first vacuum chamber support rail enables adjusting location and position of a separate movable reaction chamber inside the vacuum chamber.

In one embodiment the vacuum chamber comprises a second vacuum chamber support rail arranged inside the vacuum chamber and extending in the first direction and arranged spaced apart from the first vacuum chamber support rail. The first vacuum chamber support rail is arranged movable in relation to the vacuum chamber in vertical direction.

Thus, the separate movable reaction chamber may be supported inside the vacuum chamber to two adjacent vacuum chamber support rails.

In one embodiment, the first vacuum chamber support rail and the second vacuum chamber support rail are structurally connected to each other and arranged movable together in relation to the vacuum chamber in vertical direction.

In another embodiment, the first vacuum chamber support rail is arranged independently movable in relation to the vacuum chamber and the second vacuum chamber support rail in vertical direction, and the second vacuum chamber support rail is arranged independently movable in relation to the vacuum chamber and the first vacuum chamber support rail in vertical direction.

The independently movable first and second vacuum chamber support rails enable adjusting location and position of a separate movable reaction chamber inside the vacuum chamber. Adjusting the vertical location and position of a separate movable reaction chamber inside the vacuum chamber further enables forming gas couplings to the reaction chamber as well as securing the reaction chamber to the vacuum chamber.

In one embodiment, the vacuum chamber comprises at least one first rail support arrangement arranged to support the first vacuum chamber support rail inside the vacuum chamber and to move the first vacuum chamber support rail in the vertical direction In an alternative embodiment, the vacuum chamber comprises at least one first rail support arrangement arranged to support the first vacuum chamber support rail and the second vacuum chamber support rail inside the vacuum chamber and to move the first vacuum chamber support rail and the second vacuum chamber in the vertical direction.

In one embodiment, the vacuum chamber comprises at least one first rail support arrangement arranged to support the first vacuum chamber support rail inside the vacuum chamber and to move the first vacuum chamber support rail in the vertical direction, and at least one second rail support arrangement arranged to support the second vacuum chamber support rail inside the vacuum chamber and to move the second vacuum chamber support rail in the vertical direction.

Therefore, the first and second vacuum chamber support rails may be moved independently of each other inside the vacuum chamber such that position and posture of the reaction chamber supported to the first and second vacuum chamber support rails may be adjusted.

In one embodiment, the first rail support arrangement comprises a first lifting motor arranged to move the first vacuum chamber support rail in relation to the vacuum chamber in vertical direction.

In another embodiment, the first rail support arrangement comprises a first lifting motor arranged to move the first vacuum chamber support rail and the second vacuum chamber support rail in relation to the vacuum chamber rail in vertical direction.

In yet another embodiment, the first rail support arrangement comprises a first lifting motor arranged to move the first vacuum chamber support rail in relation to the vacuum chamber and the second vacuum chamber support rail in vertical direction, and the second rail support arrangement comprises a second lifting motor arranged to move the second vacuum chamber support rail in relation to the vacuum chamber and the first vacuum chamber support rail in vertical direction.

The separate first and second lifting motors provide independent movement of the first and second vacuum chamber support rails in vertical direction.

In one embodiment, the first vacuum chamber support rail is arranged movable in relation to the vacuum chamber in vertical direction such that the first vacuum chamber support rail is arranged movable in vertical direction and to be tilted in relation to horizontal direction.

In another embodiment, the first vacuum chamber support rail and the second vacuum chamber support rails are arranged movable in relation to the vacuum chamber in vertical direction such that the first vacuum chamber support rail and the second vacuum chamber support rail are arranged movable in vertical direction and to be tilted in relation to horizontal direction.

In a further embodiment, the first vacuum chamber support rail is arranged independently movable in relation to the vacuum chamber and the second vacuum chamber support rail in vertical direction such that the first vacuum chamber support rail is arranged independently movable in vertical direction and to be independently tilted in relation to horizontal direction and to the second vacuum chamber support rail. Further, the second vacuum chamber support rail is arranged independently movable in relation to the vacuum chamber and the first vacuum chamber support rail in vertical direction such that the second vacuum chamber support rail is arranged independently movable in vertical direction and to be independently tilted in relation to horizontal direction and to the first vacuum chamber support rail.

Accordingly, the first and second vacuum chamber support rails may be independently moved in vertical direction and further tilted in the longitudinal direction, in the first direction, in relation to horizontal direction. This enables adjusting location of the reaction chamber in vertical direction inside the vacuum chamber and also position and posture of the reaction chamber in relation to the horizontal direction.

In one embodiment, the vacuum chamber comprises a first front rail support arrangement and a first back rail support arrangement arranged to support the first vacuum chamber support rail inside the vacuum chamber and to move the first vacuum chamber support rail in the vertical direction, the first front rail support arrangement and the first back rail support arrangement being arranged spaced apart from each other along the first vacuum chamber support rail in the first direction.

In another embodiment, the vacuum chamber comprises a first front rail support arrangement and a first back rail support arrangement arranged to support the first vacuum chamber support rail inside the vacuum chamber and to move the first vacuum chamber support rail in the vertical direction, the first front rail support arrangement and the first back rail support arrangement being arranged spaced apart from each other along the first vacuum chamber support rail in the first direction. The vacuum chamber further comprises a second front rail support arrangement and a second back rail support arrangement arranged to support the second vacuum chamber support rail inside the vacuum chamber and to move the second vacuum chamber support rail in the vertical direction, the second front rail support arrangement and the second back rail support arrangement being arranged spaced apart from each other along the second vacuum chamber support rail in the first direction.

The front and back rail support arrangements separately support and move the respective vacuum chamber support rail such that moving in vertical direction and tilting in relation to horizontal direction is achieved.

In one embodiment, the first front rail support arrangement comprises a first front lifting motor and the first back rail support arrangement comprises a first back lifting motor, the first front lifting motor and the first back lifting motor are arranged to move the first vacuum chamber support rail in vertical direction independently of each other.

In another embodiment, the first front rail support arrangement comprises a first front lifting motor and the first back rail support arrangement comprises a first back lifting motor, the first front lifting motor and the first back lifting motor are arranged to move the first vacuum chamber support rail in vertical direction independently of each other. Further, the second front rail support arrangement comprises a second front lifting motor and the second back rail support arrangement comprises a second back lifting motor, the second front lifting motor and the second back lifting motor are arranged to move the second vacuum chamber support rail in vertical direction independently of each other.

The front and back lifting motors in each vacuum chamber support rail enable tilting the vacuum chamber support rails freely in relation horizontal direction.

In one embodiment, the first vacuum chamber support rail comprises a first front end and a first back end, the first vacuum chamber support rail extending in the first direction between the first front end and the first back end. The first front rail support arrangement is connected to the first vacuum chamber support rail at the first front end or in vicinity thereof and the first back rail support arrangement is connected to the first vacuum chamber support rail at the first back end or in vicinity thereof.

In another embodiment, the first vacuum chamber support rail comprises a first front end and a first back end, the first vacuum chamber support rail extending in the first direction between the first front end and the first back end. The first front rail support arrangement is connected to the first vacuum chamber support rail at the first front end or in vicinity thereof and the first back rail support arrangement is connected to the first vacuum chamber support rail at the first back end or in vicinity thereof. Further, the second vacuum chamber support rail comprises a second front end and a second back end, the second vacuum chamber support rail extending in the first direction between the second front end and the second back end. The second front rail support arrangement is connected to the second vacuum chamber support rail at the second front end or in vicinity thereof and the second back rail support arrangement is connected to the second vacuum chamber support rail at the second back end or in vicinity thereof.

Arranging the front and back rail support arrangement to the front and back ends, or in the vicinity thereof, provides good support for the vacuum chamber support rails and also detailed tilting of the vacuum chamber support rails.

In one embodiment, the first rail support arrangement comprise a support arm connected to the first vacuum chamber support rail, and arranged to extend from outside the vacuum chamber through a bottom wall of the vacuum chamber, the support arm being arranged to support the first vacuum chamber support rail in vertical direction.

In another embodiment, the first and second rail support arrangements comprise a support arm connected to the first and second vacuum chamber support rails, respectively, and arranged to extend from outside the vacuum chamber through a bottom wall of the vacuum chamber, the support arm being arranged to support the first and second vacuum chamber support rails, respectively, in vertical direction.

Thus, the mechanisms for moving the vacuum chamber support rails may be arranged outside the vacuum chamber.

In one embodiment, the first and second lifting motors of the first and second rail support arrangements are arranged outside the vacuum chamber.

Arranging the lifting motors outside the vacuum chamber prevents subjecting the lifting motors to vacuum. Further, maintenance and operating the motors may be carried out efficiently.

In one embodiment, the vacuum chamber comprises one or more first support forks arranged inside the vacuum chamber, the one or more first support forks comprise two first vertically extending fork elements. The first vacuum chamber support rail is arranged between the two first vertically extending fork elements and arranged to move in vertical direction between the two first vertically extending fork elements.

In another embodiment, the vacuum chamber comprises one or more first support forks arranged inside the vacuum chamber, the one or more first support forks comprise two first vertically extending fork elements. The first vacuum chamber support rail is arranged between the two first vertically extending fork elements and arranged to move in vertical direction between the two first vertically extending fork elements. The vacuum chamber also comprises one or more second support forks arranged inside the vacuum chamber, the one or more second support forks comprise two second vertically extending fork elements. The second vacuum chamber support rail is arranged between the two second vertically extending fork elements and arranged to move in vertical direction between the two second vertically extending fork elements.

The support forks provide lateral or horizontal support for the vacuum chamber support rails as well as enable moving the vacuum chamber support rails in vertical direction.

In one embodiment, the vacuum chamber comprises a vacuum chamber gas connection arrangement for providing a gas coupling to a movable reaction chamber, the vacuum chamber gas connection arrangement being arranged to a bottom wall of the vacuum chamber such that the first or the first and second vacuum chamber support rails are arranged movable in vertical direction in relation to the vacuum chamber gas connection arrangement.

Accordingly, the vacuum chamber gas connection arrangement may be connected to the separate reaction chamber by moving the vacuum chamber support rails in vertical direction.

In one embodiment, the vacuum chamber gas connection arrangement comprises a fixed gas manifold and a flexible outer flange assembly surrounding the fixed gas manifold, the flexible outer flange assembly is arranged flexible in vertical direction and comprises a first connection surface for providing the gas coupling to the movable reaction chamber.

The flexible outer flange together with the fixed gas manifold enables providing tight gas coupling by moving the vacuum chamber support rails, and thus the reaction chamber, in vertical direction and also positioning the reaction to a desired position or posture, for example inclined, inside the vacuum chamber.

The present invention is also based on the idea of providing an arrangement for atomic layer deposition. The arrangement comprises a vacuum chamber provided with a loading opening and a back wall opposite the loading wall, and a first direction extending in a direction between the loading wall and the back wall, and a movable reaction chamber.

The vacuum chamber comprises a first vacuum chamber support rail arranged inside the vacuum chamber and extending in the first direction. The movable reaction chamber comprises a first reaction chamber support track extending in a third direction of the reaction chamber and arranged to be supported to the first vacuum chamber transport rail. The first vacuum chamber support rail is arranged movable in relation to the vacuum chamber in vertical direction.

In one embodiment, the vacuum chamber comprises a first vacuum chamber support rail arranged inside the vacuum chamber and extending in the first direction and a second vacuum chamber support rail arranged inside the vacuum chamber and extending in the first direction and arranged spaced apart from the first vacuum chamber support rail. The movable reaction chamber comprises a first reaction chamber support track extending in a third direction of the reaction chamber and arranged to be supported to the first vacuum chamber transport rail, and a second reaction chamber support track extending in the third direction of the reaction chamber and spaced apart from the first reaction chamber support track and arranged to be supported to the second vacuum chamber transport rail.

The first vacuum chamber support rail and the second vacuum chamber support rail are arranged movable together in relation to the vacuum chamber in vertical direction. Alternatively, the first vacuum chamber support rail is arranged independently movable in relation to the vacuum chamber and the second vacuum chamber support rail in vertical direction, and the second vacuum chamber support rail is arranged independently movable in relation to the vacuum chamber and the first vacuum chamber support rail in vertical direction.

Accordingly, the vertical position of the separate movable reaction chamber may be adjusted inside the vacuum chamber.

In one embodiment, the first vacuum chamber support rail is arranged independently movable in relation to the vacuum chamber in vertical direction such that the first vacuum chamber support rail is arranged movable in vertical direction and to be tilted in relation to horizontal direction.

In another embodiment, the first vacuum chamber support rail and the second vacuum chamber support rails are arranged movable in relation to the vacuum chamber in vertical direction such that the first vacuum chamber support rail and the second vacuum chamber support rail are arranged movable together in vertical direction and to be tilted together in relation to horizontal direction.

In a further embodiment, the first vacuum chamber support rail is arranged independently movable in relation to the vacuum chamber and the second vacuum chamber support rail in vertical direction such that the first vacuum chamber support rail is arranged independently movable in vertical direction and to be independently tilted in relation to horizontal direction and to the second vacuum chamber support rail. The second vacuum chamber support rail is arranged independently movable in relation to the vacuum chamber and the first vacuum chamber support rail in vertical direction such that the second vacuum chamber support rail is arranged independently movable in vertical direction and to be independently tilted in relation to horizontal direction and to the first vacuum chamber support rail.

Accordingly, the reaction chamber may be moved in vertical direction inside the vacuum chamber and also tilted in relation to horizontal direction by moving vacuum chamber support rails.

In one embodiment, the vacuum chamber comprises a vacuum chamber gas connection arrangement provided inside the vacuum chamber and comprising a first connection surface, and the movable reaction chamber comprises a reaction chamber gas connection arrangement provided with a second contact surface. The first contact surface of the vacuum chamber gas connection arrangement and the second contact surface of the reaction chamber gas connection arrangement are arranged to connect to each other in vertical direction for providing a gas coupling upon moving the first and second vacuum chamber support rail in vertical direction.

Accordingly, the gas coupling to the movable separate reaction chamber may be carried out by moving the reaction chamber inside the vacuum chamber.

In one embodiment, the vacuum chamber gas connection arrangement comprises a fixed gas manifold and a flexible outer flange assembly surrounding the fixed gas manifold, the flexible outer flange assembly is arranged flexible in vertical direction.

The flexible outer flange provides simple and efficient sealing between the vacuum chamber gas connection arrangement and the reaction chamber gas connection arrangement.

In the arrangement, the vacuum chamber is preferably a vacuum chamber as described above.

According to the above mentioned, the vacuum chamber may comprise one or more vacuum chamber support rails for supporting the separate movable reaction chamber inside the vacuum chamber. The one or more vacuum chamber support rails are preferably provided to or in connection with the bottom wall of the vacuum chamber. However, the in alternative embodiment, the one or more vacuum chamber support rails are provided to top wall or one or more side walls of the vacuum chamber. Similarly, the separate movable reaction chamber may comprise one or more reaction chamber support tracks.

An advantage of the invention is that the independently movable vacuum chamber support rails enable adjusting the position and inclination of the reaction chamber inside the vacuum chamber. Therefore, the gas couplings for supplying gases into the reaction chamber and discharging gases from the reaction chamber may be done automatically by adjusting the location and position of the reaction chamber in the vacuum chamber with the movable vacuum chamber support rails. Further, the reaction chamber may also be secured in place by moving the vacuum chamber support rails and thus the reaction chamber.

BRIEF DESCRIPTION OF THE DRAWINGS

The invention is described in detail by means of specific embodiments with reference to the enclosed drawings, in which.

DETAILED DESCRIPTION OF THE INVENTION

Figure 1:
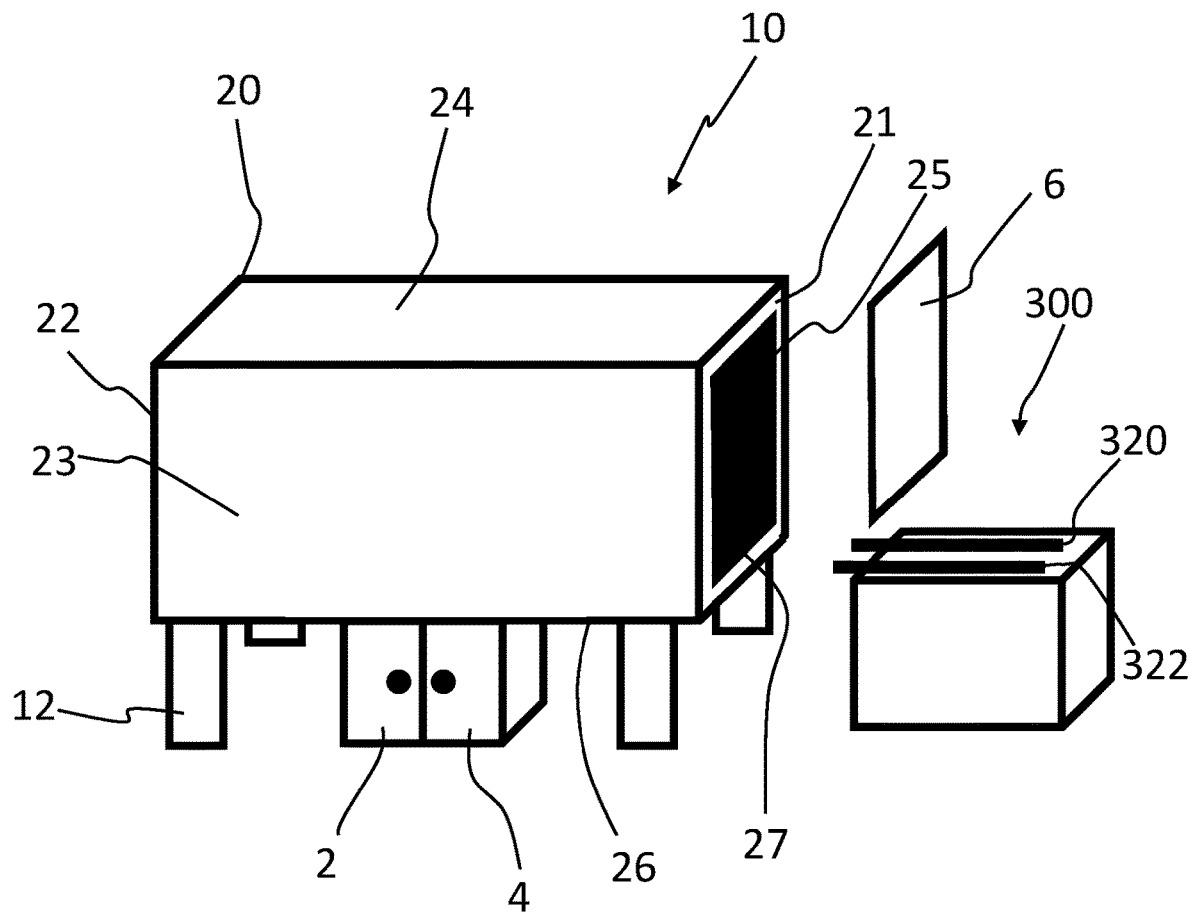
FIG. 1 shows schematically a view of an atomic layer deposition apparatus.

FIG. 1 shows schematically an arrangement for atomic layer deposition or an atomic layer deposition reactor arrangement having an atomic layer deposition reactor 10.

The atomic layer deposition reactor 10 comprises a vacuum chamber 20 having a front wall 21, or a loading wall 21, provided with a loading opening 25 for loading and unloading substrates or separate reaction chambers inside and from the vacuum chamber 20. The loading wall 21 is a vertically or upwards extending loading wall 21. The loading opening 25 provides an opening between inside of the vacuum chamber 20 and outside of the vacuum chamber 20. The loading opening 25 is provided with a loading door 6 for opening and closing the loading opening 25. The loading door 6 is schematically shown in FIG. 1.

The vacuum chamber 20 further comprises a back wall 22 opposite the front wall 21, a top wall 24, a bottom wall 26 opposite top wall 24, and side walls 23 extending between the front wall 21 and the back wall 22 and between the top wall 24 and the bottom wall 26.

In an alternative embodiment, the vacuum chamber 20 may be cylindrical vacuum chamber extending in horizontal direction. The top wall 24, bottom wall 26 and the side walls 23 are replaced by a cylindrical sheath wall extending between the front wall 21 and the back wall 22.

The vacuum chamber walls 21, 22, 23, 24, 26 are provided structurally vacuum sustainable. Thus, the vacuum chamber walls 21, 22, 23, 24, 26 are arranged to sustain considerable vacuum conditions during processing without damaging.

The atomic layer deposition reactor 10 comprises chamber support legs 12 for supporting the vacuum chamber 20 on a support surface, such as a facility floor. The chamber support legs 12 are provided such that the vacuum chamber 20 and the loading opening 25 are arranged at a handling height from the support surface enabling loading and unloading of substrates or separate reaction chambers into and from the vacuum chamber without need to lift or move the substrates or separate reaction chambers in vertical direction. The loading opening 25 comprises a lower loading opening edge 27 arranged at the handling height.

The chamber support legs 12 are provided under the vacuum chamber 20. The chamber support legs 12 extend from and are provided to the bottom surface 26 of the vacuum chamber 20.

It should be noted that the chamber support legs 12 may be replaced with any suitable support members arranged to support the vacuum chamber 20 on the support surface.

The atomic layer deposition reactor 10 further comprises a precursor system 2 arranged to supply one or more precursor gases to a reaction chamber inside the vacuum chamber 20 and to discharge precursor gases from the reaction chamber inside the vacuum chamber 20. The precursor system 2 comprises one or more precursor sources (not shown), supply conduits (not shown), discharge conduits (not shown) and one or more supply and/or discharge pumps (not shown). The precursor system 2 is arranged to subject the surfaces of the substrates to one or more precursor gases inside the vacuum chamber 20 and the reaction chamber.

The atomic layer deposition reactor 10 further comprises vacuum system 4 arranged to provide vacuum inside vacuum chamber 20 when the loading opening 25 is closed. The vacuum system 4 comprises one or more vacuum devices such as vacuum pumps for generating the vacuum conditions inside the vacuum chamber 20.

It should be noted that in some embodiment, the vacuum chamber 20 forms also the reaction chamber.

The arrangement is further provided with a loading device 100. The loading device is arranged opposite the loading wall 21 and the loading opening 25 of the vacuum chamber 20. The loading device 100 is arranged to load a separate reaction chamber or separate substrates into the vacuum chamber 20 through the loading opening 25. The loading device 100 is arranged to load a separate reaction chamber or separate substrates into the vacuum chamber 20 through the loading opening 25.

The loading device 100 comprises a first loading member 120 and a second loading member 122. The first and second loading member 120, 122 are arranged to load and unload a separate reaction chamber to and from the vacuum chamber 20 via the loading opening 25.

The first and second loading members 120, 122 are arranged in the loading device 100 above the lower loading opening edge 27 such that the separate reactor chamber is arranged to be transported to and from the vacuum chamber in horizontal direction.

Figure 2:
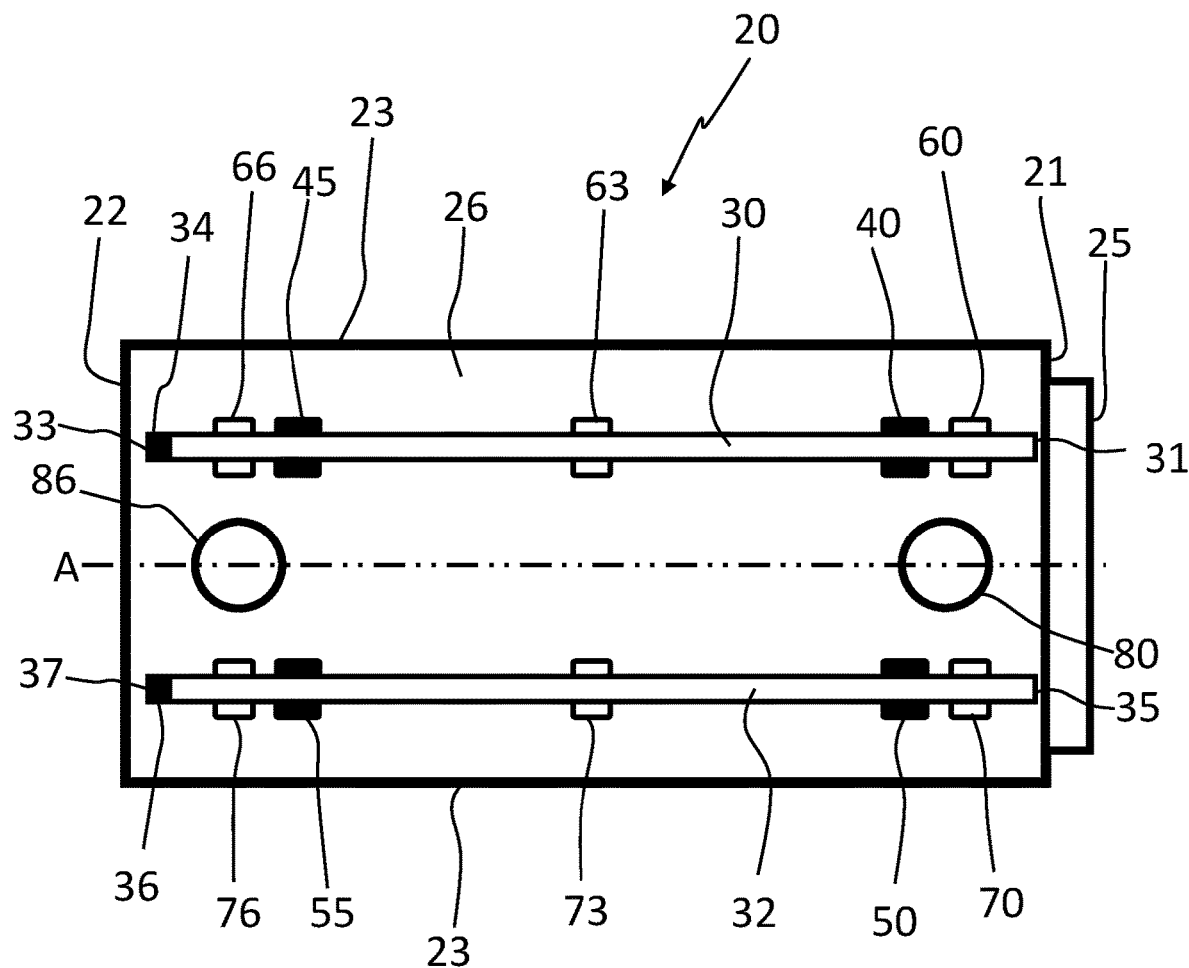
FIG. 2 shows schematically a cross-sectional top view of a vacuum chamber according to one embodiment of the invention.

FIG. 2 shows a schematic cross sectional top view of the vacuum chamber 20. The vacuum chamber 20 comprises a first direction A extending in a direction between the loading wall 21 and the back wall 22.

The vacuum chamber 20 further comprises a first vacuum chamber support rail 30 provided as a longitudinal rail extending in the first direction A. The first vacuum chamber support rail 30 comprises a first front end 31 and a first back end 33 and the first vacuum chamber support rail 30 extends between the first front end 31 and the first back end 33. The first front end 31 is arranged towards the loading wall 21 and the first back end 33 is arranged towards the back wall 22.

The first vacuum chamber support rail 30 is provided to the bottom wall 26 or in connection with the bottom wall 26 of the vacuum chamber 20.

The first vacuum chamber support rail 30 is supported to the vacuum chamber 20 with a first front support arm 40 and with a first back support arm 45. The first front support arm 40 and the first back support arm 45 are connected to the first vacuum chamber support rail 30 spaced apart from each other along the first vacuum chamber support rail 30 in the first direction A.

The first front support arm 40 is arranged to support the first vacuum chamber support rail 30 at the first front end 31 or in the vicinity thereof. Thus, the first front support arm 40 is connected to the first vacuum chamber support rail 30 at the first front end 31 or in the vicinity thereof.

In the context of this application, the definition in the vicinity of the first front end 31 means that distance from the first front support arm 40 to the first front end 31 is less than the distance from the first front support arm 40 to the first back end 33.

The first back support arm 45 is arranged to support the first vacuum chamber support rail 30 at the first back end 33 or in the vicinity thereof. Thus, the first back support arm 45 is connected to the first vacuum chamber support rail 30 at the first back end 33 or in the vicinity thereof.

In the context of this application, the definition in the vicinity of the first back end 33 means that distance from the first back support arm 45 to the first back end 33 is less than the distance from the first back support arm 45 to the first front end 31.

The first front support arm 40 and the first back support arm 45 are arranged to support the first vacuum chamber support rail 30 in vertical direction from below the first vacuum chamber support rail 30.

The first vacuum chamber support rail 30 comprises a first stopper 34 provided to the first back end 33 and extending upwards from the first vacuum chamber support rail 30.

Figure 8:
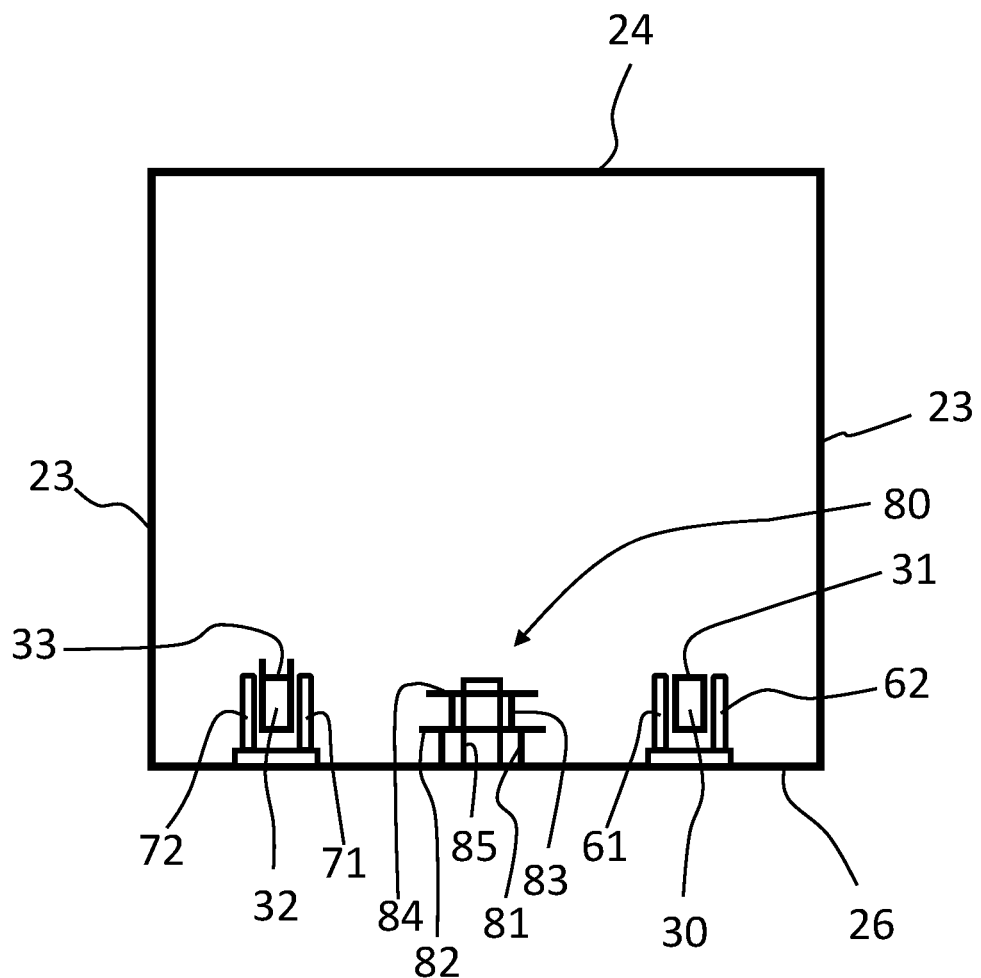
FIG. 8 shows schematically cross-sectional end views of a vacuum chamber according to one embodiment of the invention.

The vacuum chamber 20 further comprises first support forks 60, 63, 66 arranged to provide lateral support or support the first vacuum chamber support rail 30 from side or in horizontal direction. The first support forks 60, 63, 66 comprise a fork gap provided between two first vertically extending fork elements 61, 62 of each first support fork 60, 63, 66, as shown in FIG. 8. The first vacuum chamber support rail 30 is arranged between the two first vertically extending fork elements 61, 62

The first support forks 60, 63, 66 are provided to the bottom wall 26 of the vacuum chamber 20 and the two first vertically extending fork elements 61, 62 extend in vertical direction upwards from the bottom wall 26.

There may be one or more first support forks 60, 63, 66 along the first vacuum chamber support rail 30 in the first direction A.

In the embodiment of the figures, there are three first support forks 60, 63, 66. A first front support fork 60 is arranged to the first front end 31 or in the vicinity thereof, and a first back support fork 66 is arranged to the first back end 33 or in the vicinity thereof. Further, a first middle support fork 63 is arranged between the first front support fork 60 and the first back support fork 66.

Further, the first front support fork 60 is arranged between the first front end 31 and the first front support arm 40. The first back support fork 66 is arranged between the first back end 33 and the first back support arm 45. The first middle support fork 63 is arranged between the first front support arm 40 and the first back support arm 45.

The vacuum chamber 20 further comprises a second vacuum chamber support rail 32 provided as a longitudinal rail extending in the first direction A. The second vacuum chamber support rail 32 comprises a second front end 35 and a second back end 37 and the second vacuum chamber support rail 32 extends between the second front end 35 and the second back end 35. The second front end 35 is arranged towards the loading wall 21 and the second back end 37 is arranged towards the back wall 22. The second vacuum chamber support rail 32 is provided to the bottom wall 26 or in connection with the bottom wall 26 of the vacuum chamber 20.

The second vacuum chamber support rail 32 is supported to the vacuum chamber 20 with a second front support arm 50 and with a second back support arm 55. The second front support arm 50 and the second back support arm 55 are connected to the second vacuum chamber support rail 32 spaced apart from each other along the second vacuum chamber support rail 32 in the first direction A.

The second front support arm 50 is arranged to support the second vacuum chamber support rail 32 at the second front end 35 or in the vicinity thereof. Thus, the second front support arm 50 is connected to the second vacuum chamber support rail 32 at the second front end 35 or in the vicinity thereof.

In the context of this application, the definition in the vicinity of the second front end 35 means that distance from the second front support arm 50 to the second front end 35 is less than the distance from the second front support arm 50 to the second back end 33.

The second back support arm 55 is arranged to support the second vacuum chamber support rail 32 at the second back end 37 or in the vicinity thereof. Thus, the second back support arm 55 is connected to the second vacuum chamber support rail 32 at the second back end 33 or in the vicinity thereof.

In the context of this application, the definition in the vicinity of the second back end 37 means that distance from the second back support arm 55 to the second back end 37 is less than the distance from the second back support arm 55 to the second front end 37.

The second front support arm 50 and the second back support arm 55 are arranged to support the second first vacuum chamber support rail 32 in vertical direction from below the second vacuum chamber support rail 32.

The second vacuum chamber support rail 32 comprises a second stopper 36 provided to the second back end 37 and extending upwards from the second vacuum chamber support rail 32.

The vacuum chamber 20 further comprises second support forks 70, 73, 76 arranged to provide lateral support or support the second vacuum chamber support rail 32 from side or in horizontal direction. The second support forks 70, 73, 76 comprise a fork gap provided between two second vertically extending fork elements 71, 72 of each second support fork 70, 73, 76, as shown in FIG. 8. The second vacuum chamber support rail 32 is arranged between the two second vertically extending fork elements 71, 72

The second support forks 70, 73, 76 are provided to the bottom wall 26 of the vacuum chamber 20 and the two second vertically extending fork elements 71, 72 extend in vertical direction upwards from the bottom wall 26.

There may be one or more second support forks 70, 73, 76 along the second vacuum chamber support rail 32 in the first direction A.

In the embodiment of the figures, there are three second support forks 70, 73, 76. A second front support fork 70 is arranged to the second front end 35 or in the vicinity thereof, and a second back support fork 76 is arranged to the second back end 37 or in the vicinity thereof. Further, a second middle support fork 73 is arranged between the second front support fork 70 and the second back support fork 76.

Further, the second front support fork 70 is arranged between the second front end 35 and the second front support arm 50. The second back support fork 76 is arranged between the second back end 37 and the second back support arm 55. The second middle support fork 73 is arranged between the second front support arm 50 and the second back support arm 55.

As shown in FIG. 2, the vacuum chamber 20 is provided two vacuum chamber gas connection arrangements 80, 86. The vacuum chamber gas connection arrangements 80, 86 are provided to the bottom wall 26 of the vacuum chamber 20.

The vacuum chamber 20 comprises a vacuum chamber gas supply connection arrangement 80 connected to the precursor system 2 and arranged to supply one or more precursor gases to the reaction chamber inside the vacuum chamber 20. The vacuum chamber gas supply connection arrangement 80 is provided in connection with or in vicinity of the loading wall 21.

The vacuum chamber 20 comprises a vacuum chamber gas discharge connection arrangement 86 connected to the precursor system 2 and to discharge device thereof, and arranged to discharge gases from the reaction chamber inside the vacuum chamber 20. The vacuum chamber gas discharge connection arrangement 86 is provided in connection with or in vicinity of the back wall 22.

Figure 9:
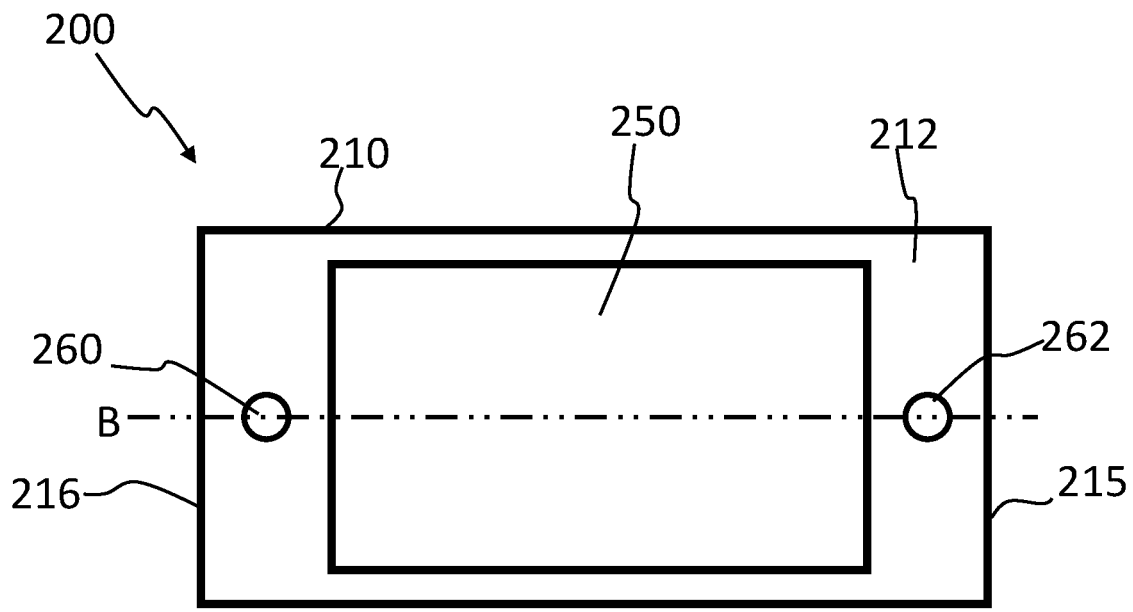
FIGS. 9, 10 and 11 show schematically views of a reaction chamber to be provided inside the vacuum chamber.

The vacuum chamber gas connection arrangements 80, 86 are provided inside the vacuum chamber 20. The vacuum chamber gas connection arrangements 80, 86 comprise a fixed gas manifold 85 arranged open to the vacuum chamber 20 and arranged to supply or discharges gases. vacuum chamber gas connection arrangements 80, 86 further comprise a first contact surface 84 facing upwards towards the inside of the vacuum chamber 20, as shown in FIGS. 8 and 9.

The fixed gas manifold 85 may be open upwards inside the vacuum chamber 20. The fixed gas manifold 85 is arranged to extend through the bottom wall 26 from outside the vacuum chamber 20 to inside of the vacuum chamber 20.

Figure 3:
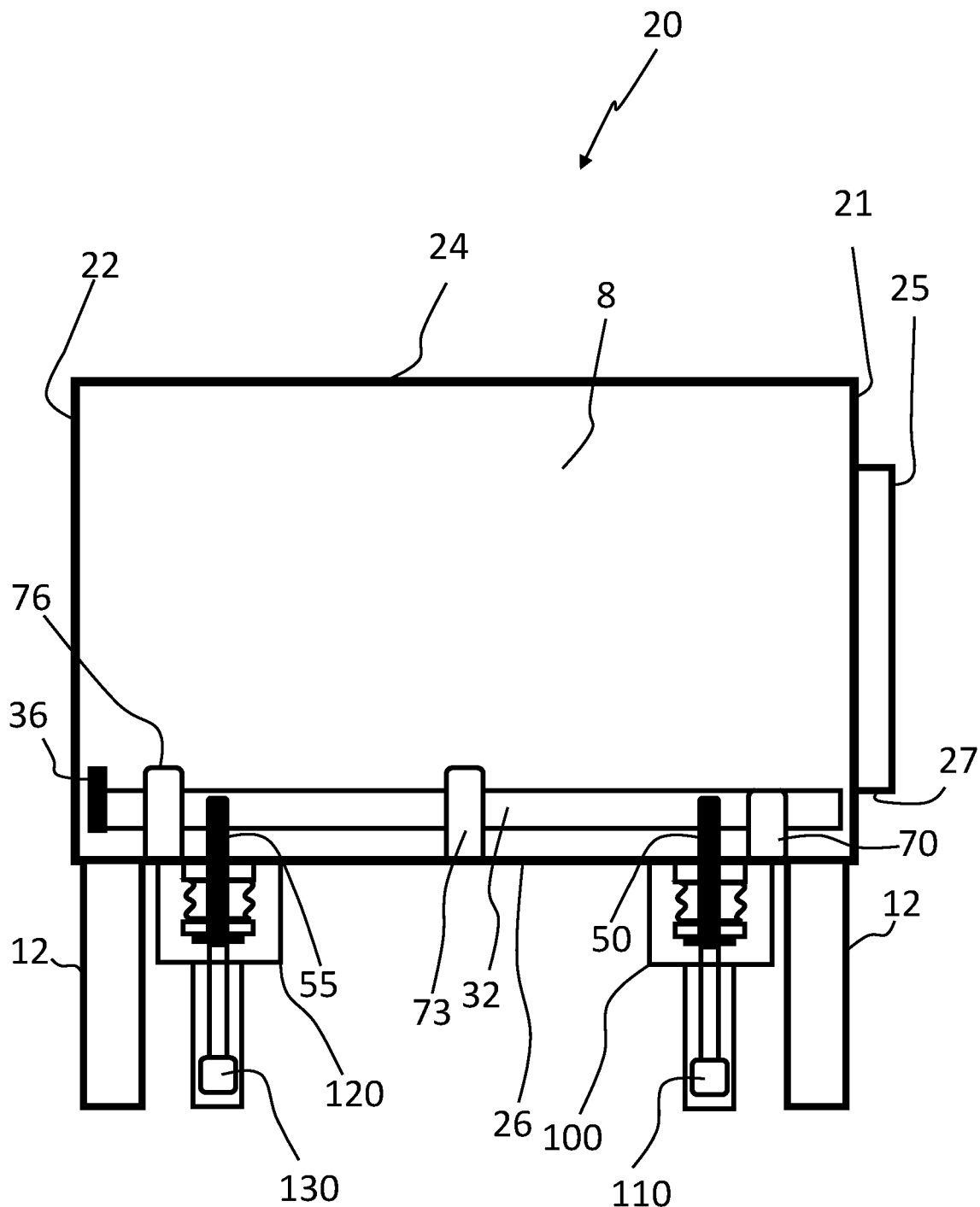
FIGS. 3 and 4 show schematically cross-sectional side views of a vacuum chamber according to one embodiment of the invention.
Figure 12:
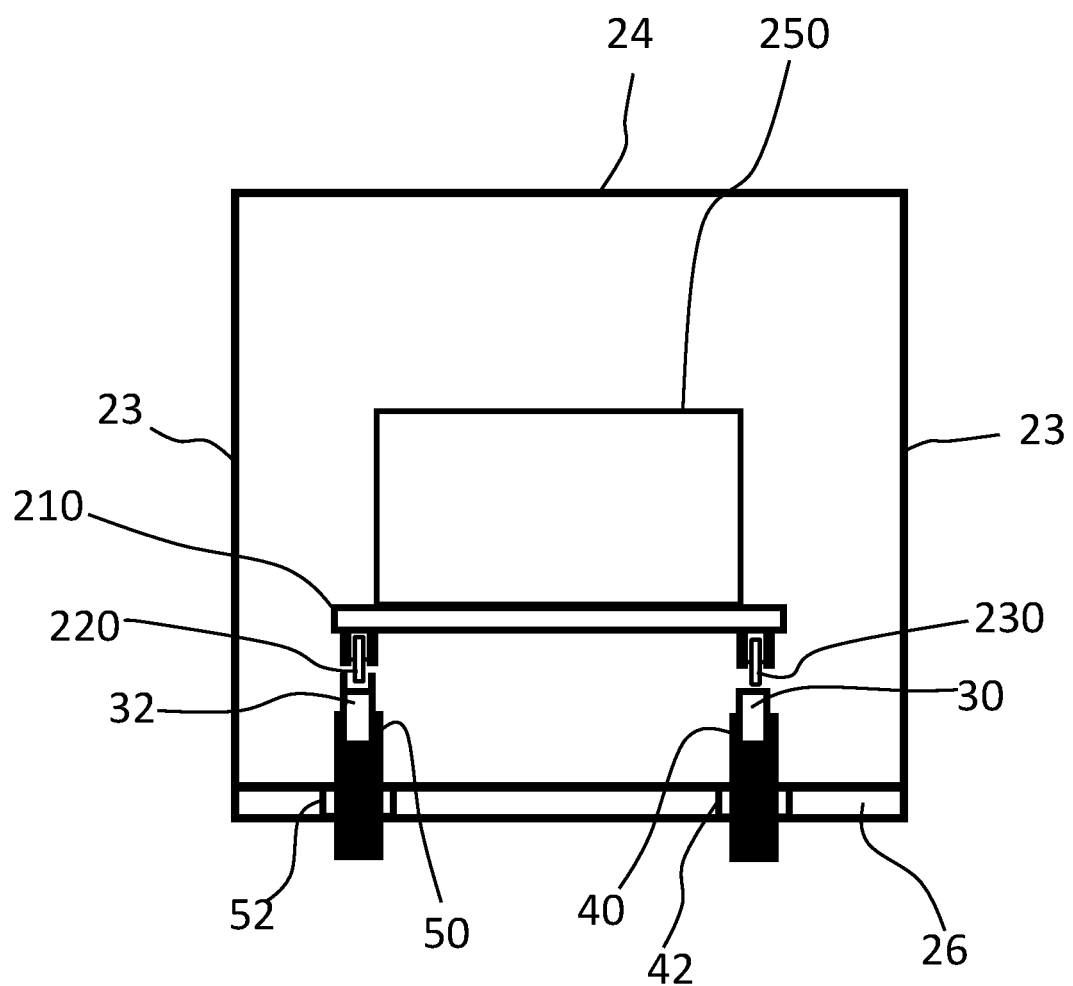
FIG. 12 shows schematically a cross-sectional end view of a vacuum chamber with a reaction chamber.

FIG. 3 shows a schematic cross sectional view of the vacuum chamber of FIG. 2 from one side. The second vacuum chamber support rail 32 extends in the first direction A and is supported to the vacuum chamber 20 with the second front and back support arms 50, 55 extending through the bottom wall 26 of the vacuum chamber 20 inside vacuum chamber space 8 via second support openings 52, as shown in FIG. 12.

It should be noted that the second front and back support arms 50, 55 may be any kind of support elements.

The vacuum chamber 20 comprises a second front rail support arrangement 100 arranged to support and move the second vacuum chamber support rail 32 in vertical direction. The second front rail support arrangement 100 comprises the second front support arm 50. The second front rail support arrangement 100 further comprises a second front lifting motor 110 operatively connected to the second front support arm 50. Thus, the second front lifting motor 110 is arranged to move the second front support arm 50 in vertical direction, and thus also the second vacuum chamber support rail 32. The connection between the second front lifting motor 110 and the second front support arm 50 is provided as a second front vacuum tight lifting connection provided to the second front rail support arrangement 100.

The second front lifting motor 110 is provided outside the vacuum chamber 20, or below the bottom wall 26 of the vacuum chamber 20. Similarly, the second front vacuum tight lifting connection is preferably provided outside the vacuum chamber 20, or below the bottom wall 26 of the vacuum chamber 20.

The vacuum chamber 20 also comprises a second back rail support arrangement 120 arranged to support and move the second vacuum chamber support rail 32 in vertical direction. The second back rail support arrangement 120 comprises the second back support arm 55. The second back rail support arrangement 120 further comprises a second back lifting motor 130 operatively connected to the second back support arm 55. Thus, the second back lifting motor 130 is arranged to move the second back support arm 55 in vertical direction, and thus also the second vacuum chamber support rail 32. The connection between the second back lifting motor 130 and the second back support arm 55 is provided as a vacuum tight lifting connection provided to the second back rail support arrangement 120.

The second back lifting motor 130 is provided outside the vacuum chamber 20, or below the bottom wall 26 of the vacuum chamber 20. Similarly, the second back vacuum tight lifting connection is preferably provided outside the vacuum chamber 20, or below the bottom wall 26 of the vacuum chamber 20.

The second front and back support arms 50, 55 are arranged independently movable with the second front and back lifting motors 110, 130. Thus, the second vacuum chamber support rail 32 is arranged movable in vertical direction and also arranged to be tilted or inclined in relation to horizontal direction.

Figure 4:
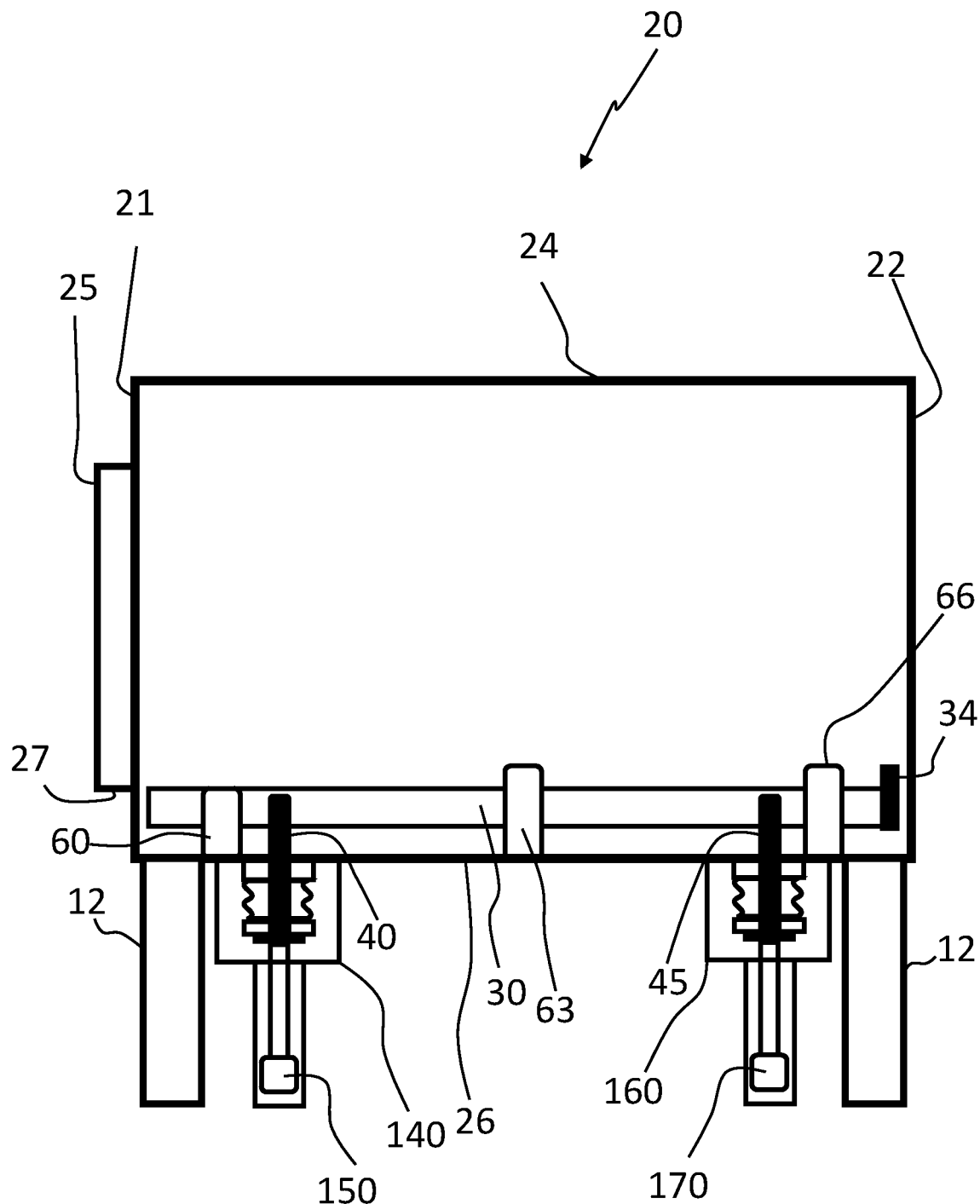

FIG. 4 shows a schematic cross sectional view of the vacuum chamber of FIG. 2 from another side. The first vacuum chamber support rail 30 extends in the first direction A and is supported to the vacuum chamber 20 with the first front and back support arms 40, 45 extending through the bottom wall 26 of the vacuum chamber 20 inside vacuum chamber space 8 via first support openings 42, as shown in FIG. 12.

It should be noted that the first front and back support arms 40, 45 may be any kind of support elements.

The vacuum chamber 20 comprises a first front rail support arrangement 140 arranged to support and move the first vacuum chamber support rail 30 in vertical direction. The first front rail support arrangement 140 comprises the first front support arm 40. The first front rail support arrangement 140 further comprises a first front lifting motor 150 operatively connected to the first front support arm 40. Thus, the first front lifting motor 150 is arranged to move the first front support arm 40 in vertical direction, and thus also the first vacuum chamber support rail 30. The connection between the first front lifting motor 150 and the first front support arm 40 is provided as a first front vacuum tight lifting connection provided to the first front rail support arrangement 140.

The first front lifting motor 150 is provided outside the vacuum chamber 20, or below the bottom wall 26 of the vacuum chamber 20. Similarly, the first front vacuum tight lifting connection is preferably provided outside the vacuum chamber 20, or below the bottom wall 26 of the vacuum chamber 20.

The vacuum chamber 20 also comprises a first back rail support arrangement 160 arranged to support and move the first vacuum chamber support rail 30 in vertical direction.

The first back rail support arrangement 160 comprises the first back support arm 45. The first back rail support arrangement 160 further comprises a first back lifting motor 170 operatively connected to the first back support arm 45. Thus, the first back lifting motor 170 is arranged to move the first back support arm 45 in vertical direction, and thus also the first vacuum chamber support rail 30. The connection between the first back lifting motor 170 and the first back support arm 45 is provided as a vacuum tight lifting connection provided to the first back rail support arrangement 160.

The first back lifting motor 170 is provided outside the vacuum chamber 20, or below the bottom wall 26 of the vacuum chamber 20. Similarly, the first back vacuum tight lifting connection is preferably provided outside the vacuum chamber 20, or below the bottom wall 26 of the vacuum chamber 20.

Figure 5:
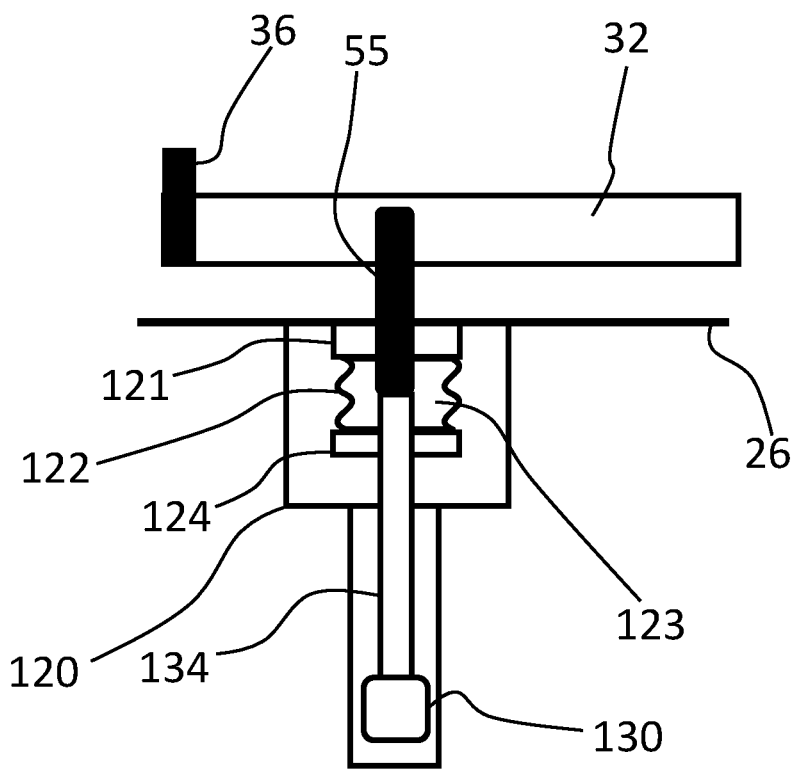
FIG. 5 shows schematically a cross sectional side view of a rail support arrangement according to one embodiment of the invention.

FIG. 5 shows the second back rail support arrangement 120 is more detail. The second back rail support arrangement 120 comprises a flexible support connection provided by a first support flange 121 and second support flange 124, and a flexible connection member 122 extending between the first and second support flange 121, 124. The first support flange 121, second support flange 124, and the tubular flexible connection member 122 together form a vacuum tight connection space 123. The second back rail support arrangement 120 comprises an actuator element 134 extending from the second back lifting motor 130 into the vacuum tight connection space 123. The second back support arm 55 is arranged to extend from the vacuum tight connection space 123 to the vacuum chamber 20 and to the second vacuum chamber support rail 32. The second back support arm 55 and the actuator element 134 are connected or operatively connected with an transfer connection together inside the vacuum tight connection space 123.

The flexible connection member 122 is arranged flexible in vertical direction. The flexible connection member 122 may be bellow or the like.

It should be noted that the above discussed concerns also the other rail support arrangements 100, 140, 160.

Figure 6:
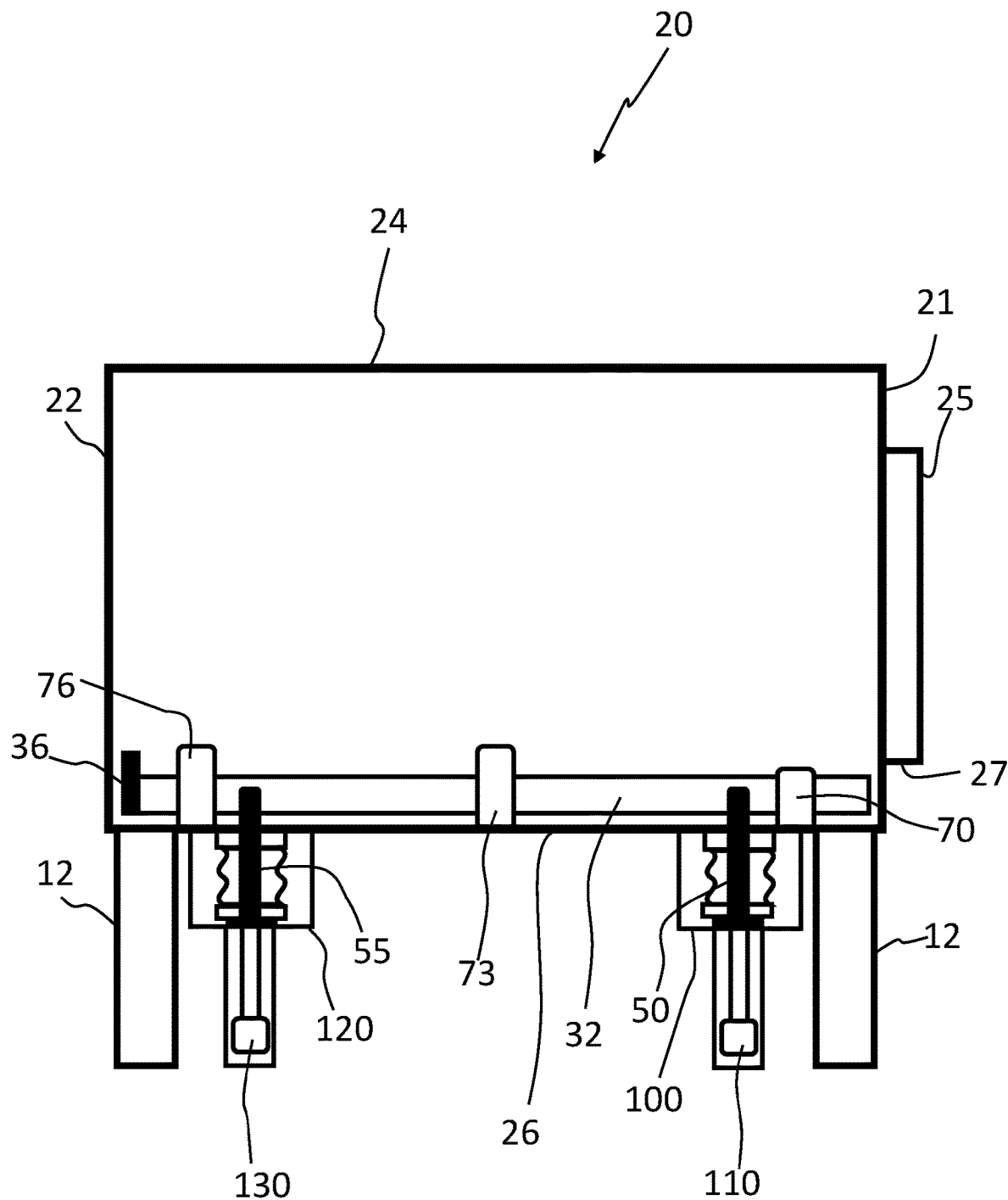
FIGS. 6 and 7 show further schematically cross-sectional side views of a vacuum chamber according to one embodiment of the invention.

FIG. 6 shows the schematic cross sectional side view of FIGS. 2 and 3. As shown in FIG. 6, the vacuum chamber support rails 30, 32 are moved to a low position in the vacuum chamber with the rail support arrangements 100, 120, 140, 160. In this low position the vacuum chamber support rails 30, 32 are arranged below the lower loading opening edge 27 of the loading opening 25.

During processing with atomic layer deposition, the vacuum chamber support rails 30, 32 are usually arranged to the low position.

Figure 7:
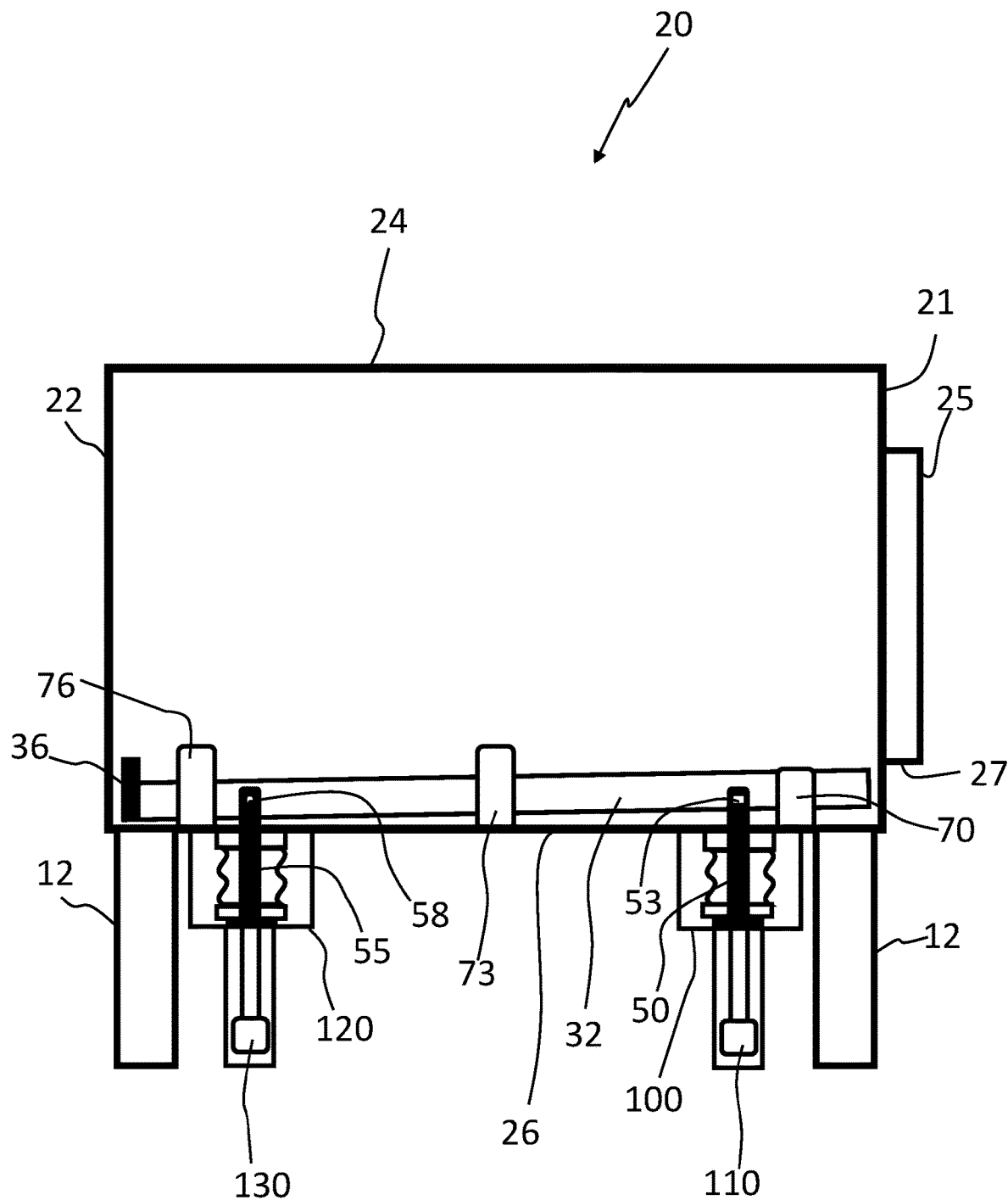

FIG. 7 shows the schematic cross sectional side view of FIGS. 2 and 3. As shown in FIG. 7, the vacuum chamber support rails 30, 32 are further moved to a low tilted position in the vacuum chamber 20 with the rail support arrangements 100, 120, 140, 160. In this low tilted position the vacuum chamber support rails 30, 32 are tilted in relation to the horizontal direction towards the loading opening 25. Thus, the back ends 33, 37 of the vacuum chamber support rails 30, 32 are arranged in vertical direction above the front ends 31, 35. During processing with atomic layer deposition, the vacuum chamber support rails 30, 32 are usually arranged to the low tilted position for securing the reaction chamber.

FIG. 8 shows the vacuum chamber gas connection arrangement 80 for providing a gas coupling to a movable reaction chamber. The vacuum chamber gas connection arrangement 80 arranged to a bottom wall 26 of the vacuum chamber 20. The first and second vacuum chamber support rails 30, 32 are arranged independently movable in vertical direction in relation to the vacuum chamber gas connection arrangement 80. Thus, the gas coupling between the reaction chamber and the vacuum chamber gas connection arrangement 80 is carried out by moving the vacuum chamber support rails 30, 32 and thus the reaction chamber.

The vacuum chamber gas connection arrangement 80 is provided inside the vacuum chamber 20.

The vacuum chamber gas connection arrangement is a flexible gas connection arrangement arranged flexible at least in vertical direction. The vacuum chamber gas connection arrangement 80 comprises a fixed gas manifold 85 and a flexible outer flange assembly 83 surrounding the fixed gas manifold 85. The flexible outer flange assembly 83 is arranged flexible in vertical direction and comprises a first connection surface 84 for providing the for coupling to the movable reaction chamber. The vacuum chamber gas connection arrangement 80 comprises a fixed outer flange assembly 81 provided between the bottom wall 26 and the flexible flange assembly 83, and supported to the bottom wall 26. The fixed outer flange assembly is arranged to surround the fixed gas manifold 85. The fixed outer flange assembly 81 comprises a connection flange 82 to which the flexible flange assembly 83 is connected and supported.

The flexible outer flange assembly 83 may comprise a bellow and one or more spring members for providing flexibility in vertical direction.

The vacuum chamber gas connection arrangement 80, and the fixed gas manifold 85 thereof, extend in vertical direction from the bottom wall 26 o the vacuum chamber 20. Thus, the gas coupling and connection with the reaction chamber is done in vertical direction and moving the reaction chamber in vertical direction by moving the vacuum chamber support rails 30, 32.

FIG. 9 shows a reaction chamber 200 which is to be supported to the vacuum chamber support rails 30, 32. The reaction chamber 200 comprises a chamber base 210 and a process chamber 250 supported to the chamber base 210. The process chamber 250 is supported on an upper base surface 212 of the chamber base 210. The chamber base 210 and the reaction chamber 200 comprises a first chamber end 215 and a second chamber end 216. The reaction chamber 200 comprises a second direction B extending in a direction between the first and second chamber ends 215, 216.

Figure 11:
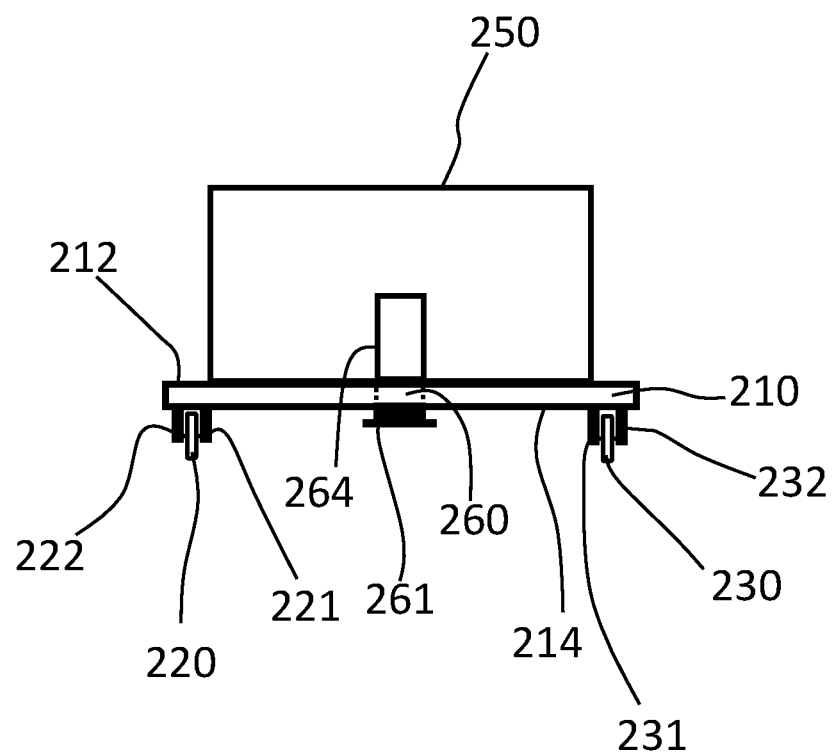

As shown in FIG. 11, the chamber base 210 is provided with a first longitudinal support track 220, 221, 222 and a second longitudinal support track 230, 231, 232. The first and second longitudinal support tracks 220, 221, 222, 230, 231, 232 are arranged space apart from each other and to extend parallel to each other in the second direction B. The first support track 220, 221, 222 is arranged to be supported to the second vacuum chamber support rail 32. The second support track 230, 231, 232 is arranged to be supported to the first vacuum chamber support rail 30.

The first and second longitudinal support tracks 220, 221, 222, 230, 231, 232 are arranged on a bottom surface 214 of the chamber base 210.

Figure 10:
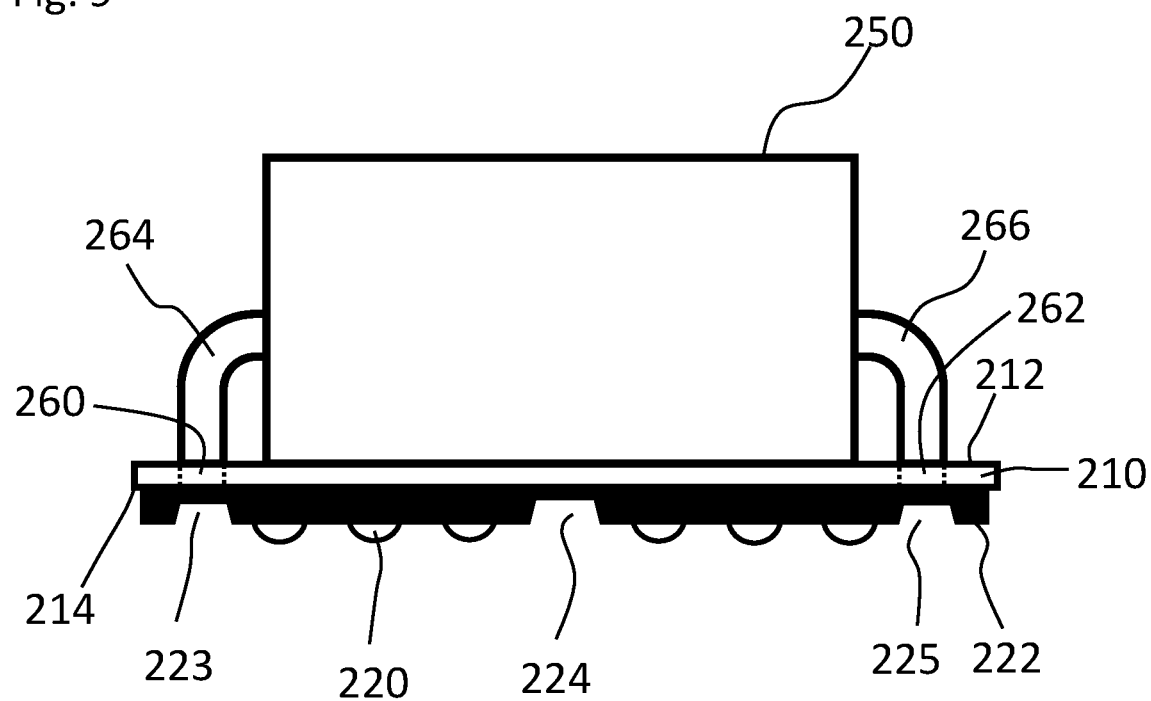

The first longitudinal support track comprises first support wheels 220 supported between opposite longitudinal wheel supports 221, 222. The first support wheels 220 are arranged successively along the first support track 220, 221, 222, as shown in FIG. 10.

FIG. 12 shows a schematic cross sectional end view in which the reaction chamber 200 is supported to the vacuum chamber support rails 30, 32 inside the vacuum chamber 20.

The first support wheels 220 are arranged to be supported to the second vacuum chamber support rail 32.

The second longitudinal support track comprises first support wheels 230 supported between opposite longitudinal wheel supports 231, 232. The second support wheels 230 are arranged successively along the second support track 230, 231, 232.

The second support wheels 230 are arranged to be supported to the first vacuum chamber support rail 30, as shown in FIG. 12.

FIG. 9 shows a top view of the reaction chamber 200. The chamber base 210 comprises a gas supply opening 260 provided between the second chamber end 216 of the chamber base 210 and the process chamber 250. The gas supply opening 260 extends through the chamber base 210. The chamber base 210 comprises a gas discharge opening 262 provided between the first chamber end 215 of the chamber base 210 and the process chamber 250. The gas discharge opening 262 extends through the chamber base 210.

FIG. 10 shows a side view of the reaction chamber 200. The reaction chamber 200 comprises gas supply conduit 264 extending between the gas supply opening 260 and the process chamber 250. The reaction chamber 200 further comprises gas discharge conduit 266 extending between the gas discharge opening 262 and the process chamber 250.

FIG. 11 further shows a gas supply connection arrangement of the reaction chamber. The gas supply connection a gas connection arrangement of the reaction chamber 200 comprises the gas supply opening 260, the gas supply conduit 264 and a second connection surface 261 provided on the bottom surface 214 of the chamber base 210.

Similarly, a gas discharge connection arrangement is provided in connection with the gas discharge opening 262.

The second connection surface 261 is arranged to face in vertical direction downwards from the bottom surface 214. The first contact surface 84 of the vacuum chamber gas connection arrangement 80, 86 and the second contact surface 261 of the reaction chamber gas connection arrangement 260, 261, 264, 262, 266 are arranged to connect to each other in vertical direction for providing a gas coupling upon moving the first and second vacuum chamber support rail 30, 32 in vertical direction. This means that the first connection surface 84 and the second connection surface 261 are arranged to be placed against each other in vertical direction by moving the vacuum chamber support rails 30, 32. Accordingly the first connection surface 84 and the second connection surface 261 are arranged substantially parallel and transverse to vertical direction.

Figure 13:
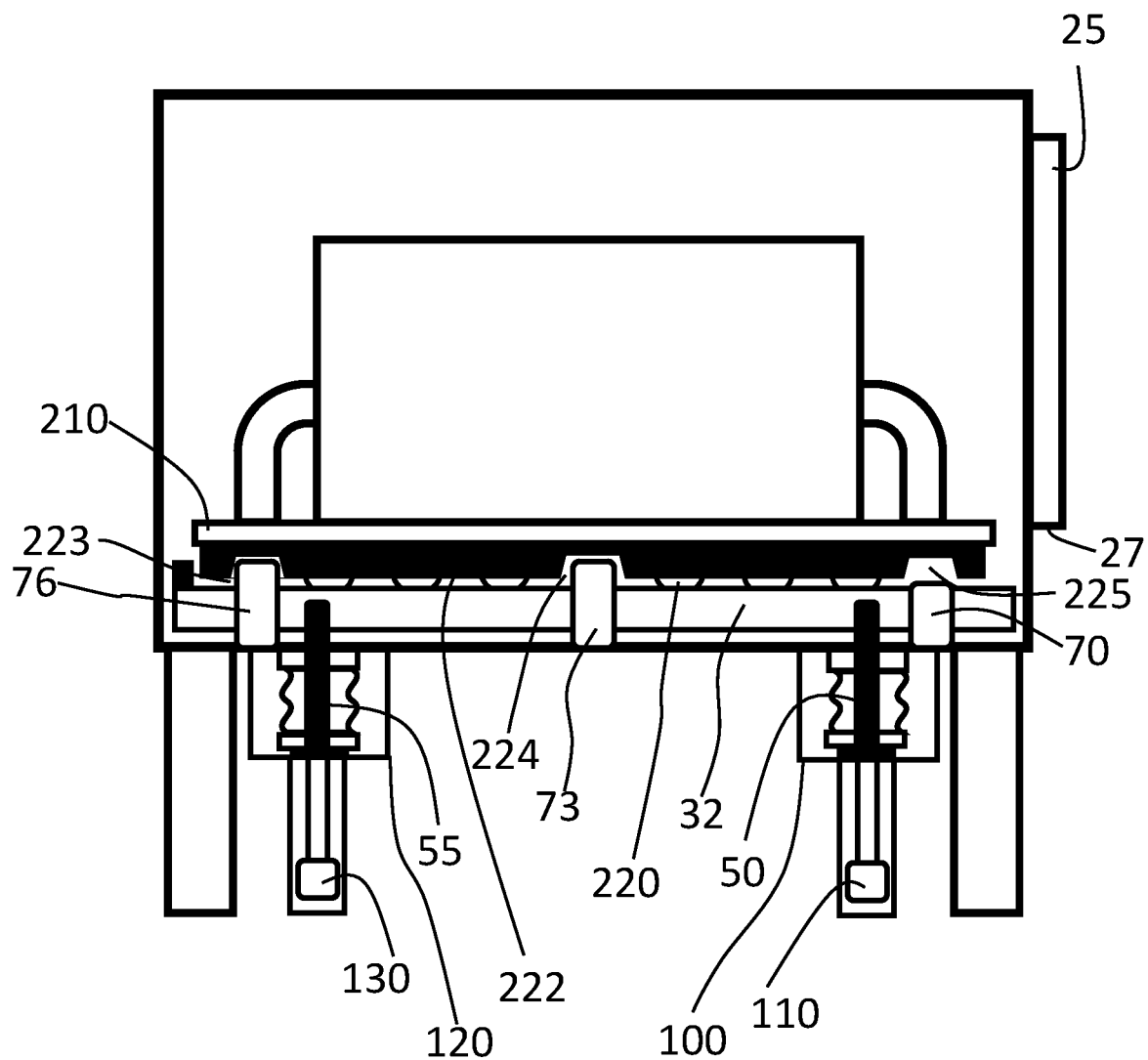
FIG. 13 shows schematically a cross-sectional side view of a vacuum chamber with a reaction chamber.

FIG. 13 further shows a schematic cross sectional side view in which the reaction chamber 200 is supported on the vacuum chamber support rails 30, 32 inside the vacuum chamber 20. The vacuum chamber support rails 30, 32 are arranged to the low position.

The wheel supports 221, 222, 231, 232 comprise locking grooves 223, 224, 225 as shown in FIG. 10. In the low position of the vacuum chamber support rails 30, 32 at least one of the support forks 60, 63, 66, 70, 73, 76 is arranged to extend into at least one locking groove 223, 224, 225 such that the reaction chamber is secured in the first direction A inside the vacuum chamber 20.

In alternative embodiment, the vacuum chamber 20 comprises one or more first locking elements, such as the support forks 60, 63, 66, 70, 73, 76, and the reaction chamber 200 comprises one or more second locking elements, such as the locking grooves 223, 224, 225. The first and second locking elements are arranged to lock to each other in vertical direction and arranged to provided locking in the first direction A, or in the direction of the vacuum chamber support rails 30, 32 and the first and second longitudinal support tracks 220, 221, 222, 230, 231, 232

The invention has been described above with reference to the examples shown in the figures. However, the invention is in no way restricted to the above examples but may vary within the scope of the claims.

The invention claimed is:

1. A vacuum chamber, comprising:
a loading wall provided with a loading opening, a back wall opposite the loading wall, and a first direction extending between the loading wall and the back wall;
one or more side walls extending between the loading wall and the back wall, the one or more side walls defining a vacuum chamber space inside the vacuum chamber;
a first vacuum chamber support rail disposed inside the vacuum chamber and extending in the first direction, the first vacuum chamber support rail configured to be moved in a vertical direction with respect to the vacuum chamber;
a vacuum chamber gas connection arrangement for providing a gas coupling to a movable reaction chamber; and
one or more first support forks arranged inside the vacuum chamber, the one or more first support forks comprise two first vertically extending fork elements, the first vacuum chamber support rail being arranged between the two first vertically extending fork elements and arranged to move in the vertical direction between the two first vertically extending fork elements with respect to the vacuum chamber.

2. The vacuum chamber according to claim 1, further comprising a second vacuum chamber support rail arranged inside the vacuum chamber and extending in the first direction and disposed spaced apart from the first vacuum chamber support rail, the second vacuum chamber support rail configured to be moved in the vertical direction with respect to the vacuum chamber.

3. The vacuum chamber according to claim 2, wherein:
the first vacuum chamber support rail and the second vacuum chamber support rail are structurally connected to each other and are movable together in the vertical direction with respect to the vacuum chamber.

4. The vacuum chamber according to claim 2, further comprising at least one first rail support arrangement arranged to support the first vacuum chamber support rail inside the vacuum chamber and to move the first vacuum chamber support rail in the vertical direction with respect to the vacuum chamber, and at least one second rail support arrangement arranged to support the second vacuum chamber support rail inside the vacuum chamber and to move the second vacuum chamber support rail in the vertical direction with respect to the vacuum chamber.

5. The vacuum chamber according to claim 4, wherein:
the first rail support arrangement comprises a first lifting motor arranged to move the first vacuum chamber support rail in the vertical direction with respect to the vacuum chamber and the second vacuum chamber support rail, and
the second rail support arrangement comprises a second lifting motor arranged to move the second vacuum chamber support rail in the vertical direction with respect to the vacuum chamber and the first vacuum chamber support rail.

6. The vacuum chamber according to claim 5, wherein the first and second lifting motors of the first and second rail support arrangements are arranged outside the vacuum chamber.

7. The vacuum chamber according to claim 4, wherein:
the first rail support arrangements comprise a support arm connected to the first vacuum chamber support rail, and arranged to extend from outside the vacuum chamber through a bottom wall of the vacuum chamber, the support arm being arranged to support the first vacuum chamber support rail.

8. The vacuum chamber according to claim 2, wherein the second vacuum chamber support rail is movable in the vertical direction with respect to the vacuum chamber gas connection arrangement.

9. The vacuum chamber according to claim 1, wherein:
the first vacuum chamber support rail is configured to be tilted in a horizontal direction with respect to the vacuum chamber.

10. The vacuum chamber according to claim 9, further comprising a first front rail support arrangement and a first back rail support arrangement arranged to support the first vacuum chamber support rail inside the vacuum chamber and to move the first vacuum chamber support rail in the vertical direction with respect to the vacuum chamber, the first front rail support arrangement and the first back rail support arrangement being spaced apart from each other along the first vacuum chamber support rail in the first direction.

11. The vacuum chamber according to claim 10, wherein:
the first front rail support arrangement comprises a first front lifting motor, and the first back rail support arrangement comprises a first back lifting motor, the first front lifting motor and the first back lifting motor are arranged to move the first vacuum chamber support rail in the vertical direction independently of each other and with respect to the vacuum chamber.

12. The vacuum chamber according to claim 10, wherein:
the first vacuum chamber support rail comprises a first front end and a first back end, the first vacuum chamber support rail extending in the first direction between the first front end and the first back end, the first front rail support arrangement being connected to the first vacuum chamber support rail at the first front end or in vicinity thereof and the first back rail support arrangement being connected to the first vacuum chamber support rail at the first back end or in vicinity thereof.

13. The vacuum chamber according to claim 1, wherein the vacuum chamber gas connection arrangement comprises a fixed gas manifold and a flexible outer flange assembly surrounding the fixed gas manifold, the flexible outer flange assembly is arranged flexible in the vertical direction and comprises a first connection surface for providing the gas coupling to the movable reaction chamber.

14. The vacuum chamber according to claim 1, wherein the vacuum chamber gas connection arrangement is arranged to a bottom wall of the vacuum chamber such that the first vacuum chamber support rail is movable in the vertical direction with respect to the vacuum chamber gas connection arrangement, and wherein the first vacuum chamber support rail is arranged on the bottom wall of the vacuum chamber.

15. An arrangement for the vacuum chamber according to claim 1, comprising:

the movable reaction chamber comprising: a first reaction chamber support track extending in the first direction and arranged to be supported by the first vacuum chamber support rail.

16. An arrangement for comprising:
a vacuum chamber provided with a loading opening and a back wall opposite the loading wall, and a first direction extending between the loading wall and the back wall, and
a movable reaction chamber,
wherein:
the vacuum chamber comprises:
a vacuum chamber gas connection arrangement provided inside the vacuum chamber and comprising a first contact surface, a fixed gas manifold, and a flexible outer flange assembly surrounding the fixed gas manifold, the flexible outer flange assembly is arranged flexible in a vertical direction;
a first vacuum chamber support rail arranged inside the vacuum chamber and extending in the first direction; and
the movable reaction chamber comprises:
a first reaction chamber support track extending in the first direction and arranged to be supported by the first vacuum chamber support rail,
a reaction chamber gas connection arrangement provided with a second contact surface, the first contact surface of the vacuum chamber gas connection arrangement and the second contact surface of the reaction chamber gas connection arrangement are arranged to connect to each other in the vertical direction for providing a gas coupling upon moving the first vacuum chamber support rail in the vertical direction; and
the first vacuum chamber support rail is configured to be moved in the vertical direction with respect to the vacuum chamber.

17. The arrangement according to claim 16, wherein the vacuum chamber comprises:
a second vacuum chamber support rail arranged inside the vacuum chamber and extending in the first direction and arranged spaced apart from the first vacuum chamber support rail; and
the movable reaction chamber comprises:
a second reaction chamber support track extending in the first direction of the reaction chamber and spaced apart from the first reaction chamber support track and arranged to be supported by the second vacuum chamber transport rail,
the first vacuum chamber support rail and the second vacuum chamber support rail being arranged movable together in relation to the vacuum chamber, or the first vacuum chamber support rail being arranged independently movable in relation to the vacuum chamber and the second vacuum chamber support rail in the vertical direction, and the second vacuum chamber support rail being arranged independently movable in relation to the vacuum chamber and the first vacuum chamber support rail in the vertical direction.

18. The arrangement according to claim 16, wherein: the first vacuum chamber support rail is configured to be tilted in a horizontal direction with respect to the vacuum chamber.

19. A vacuum chamber, comprising:
a loading wall provided with a loading opening, a back wall opposite the loading wall, and a first direction extending between the loading wall and the back wall;
one or more side walls extending between the loading wall and the back wall, the one or more side walls defining a vacuum chamber space inside the vacuum chamber;
a first vacuum chamber support rail disposed inside the vacuum chamber and extending in the first direction, the first vacuum chamber support rail configured to be moved in a vertical direction with respect to the vacuum chamber; and
a vacuum chamber gas connection arrangement for providing a gas coupling to a movable reaction chamber, the vacuum chamber gas connection arrangement includes a fixed gas manifold and a flexible outer flange assembly surrounding the fixed gas manifold, the flexible outer flange assembly is arranged flexible in the vertical direction and comprises a first connection surface for providing the gas coupling to the movable reaction chamber.

* * * * *